United States Patent [19]
Houston

[11] Patent Number: 6,074,920
[45] Date of Patent: Jun. 13, 2000

[54] SELF-ALIGNED IMPLANT UNDER TRANSISTOR GATE

[75] Inventor: Theodore W. Houston, Richardson, Tex.

[73] Assignee: Texas Instruments Incorporated, Dallas, Tex.

[21] Appl. No.: 09/335,193

[22] Filed: Jun. 17, 1999

Related U.S. Application Data

[62] Division of application No. 09/140,267, Aug. 26, 1998.

[51] Int. Cl.$^7$ .................................................. H01L 21/336
[52] U.S. Cl. .......................... 438/289; 438/217; 438/276; 438/282; 438/303; 438/306; 438/683
[58] Field of Search .................................... 438/217, 276, 438/278, 282–289, 290, 291, 303–305, 306, 683

[56] References Cited

U.S. PATENT DOCUMENTS 4,356,042  10/1982  Gelay et al. .
4,889,820  12/1989  Hori .
5,188,873   2/1993  Delannoy .
5,658,811   8/1997  Kimura et al. .

*Primary Examiner*—Wael Fahmy
*Assistant Examiner*—Long Pham
*Attorney, Agent, or Firm*—Jacqueline J. Garner; Wade James Brady; Frederick J. Telecky, Jr.

[57] ABSTRACT

The invention comprises a transistor having a self-aligned implant under the gate. The transistor comprises a drain region, a source region opposite the drain region, and a channel region in a semiconductor substrate extending between the source region and the drain region. A front gate is disposed outwardly from the first substrate layer and is separated from the channel region by a dielectric layer. The front gate comprises a first gate layer disposed outwardly from the dielectric layer and a second gate layer disposed outwardly from the first gate layer. A self-aligned implant region is disposed inwardly from the channel region and in approximate vertical alignment with the front gate.

12 Claims, 6 Drawing Sheets

SELF-ALIGNED IMPLANT UNDER TRANSISTOR GATE

This application is a division of Ser. No. 09/140,267 filed Aug. 26, 1998.

TECHNICAL FIELD OF THE INVENTION

This invention relates generally to the field of electronic devices and more particularly to a transistor having a self aligned implant region under a gate.

BACKGROUND OF THE INVENTION

Source-to-drain punch-through is a condition that occurs when the depletion region of the drain reaches the source, shorting the source and drain regions of the device. One method of avoiding this condition is to raise the doping level beneath the channel between the source and drain regions of the transistor. The raised doping region is typically formed by implanting between the source and drain regions a complementary dopant to the dopant of the source and drain regions to form a punch-through implant. For example, if the source and drain are doped with n-type dopants, the punch-through implant is doped with a p-type dopant. Higher doping reduces the extent of the drain depletion region, preventing the occurrence of source-to-drain punch-through. A problem with typical methods of implanting the punch-through implant is that it is difficult to control the precise location of the dopant and the resulting extent of the implant region. The edges of the implant region often overlap the source and drain regions of the transistor. This overlap creates a disadvantage of increased junction capacitance in the device.

The concept of a highly doped implant region is also useful in the formation of back gate transistors and back body contact transistors. These devices utilize polysilicon back gates and back body contacts, referred to generally herein as back contacts, disposed within a buried oxide layer of the transistor. In these devices, it is desirable to implant an area of dopant into the back contact to reduce the contact's resistivity. As with the punch-through implant, however, typical implantation techniques make it difficult to precisely control the area of implantation. In the back body contact transistor, stray implantation results in increased junction capacitance. In the back gate transistor, stray implantation results in increased MOS overlap capacitance.

SUMMARY OF THE INVENTION

In accordance with the teachings of the present invention a transistor having a self-aligned implant under the gate is provided that substantially eliminates or reduces the disadvantages associated with prior techniques and processes.

According to one embodiment of the present invention, a transistor having a self-aligned implant under the gate comprises a first semiconductor substrate having a drain region, a source region opposite the drain region, and a channel region between the source region and the drain region. The invention further comprises a front gate disposed outwardly from the first substrate layer and separated from the channel region by a dielectric layer. The front gate includes a first gate layer disposed outwardly from the dielectric layer and a second gate layer disposed outwardly from the first gate layer. A self-aligned implant region is disposed inwardly from the channel region and in approximate vertical alignment with the front gate.

The invention has important technical advantages. Implementing a self-aligned implantation region ensures that the resulting implantation is confined to a desired region. This avoids problems associated with overlap of the implantation region with the source and drain regions of the transistor. Junction capacitance may be better controlled and reduced by forming a well using a self-aligned implant.

BRIEF DESCRIPTION OF THE DRAWINGS

A more complete understanding of the teachings of the present invention may be acquired by referring to the accompanying figures in which like reference numbers indicate like features and wherein.

DETAILED DESCRIPTION OF THE INVENTION

Figure 1:
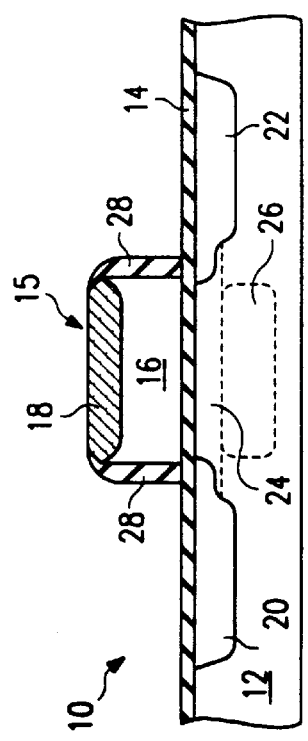
FIG. 1 is a cross-sectional view of one embodiment of a transistor having a self-aligned implant region according to the teachings of the present invention.

FIG. 1 illustrates a cross-section of one embodiment of a transistor 10 with a self-aligned implant region according to the teachings of the present invention. Transistor 10 may be formed on a first semiconductor substrate 12. First substrate 12 includes a source region 20 and a drain region 22, which define between them a channel region 24. Raised source and/or drain regions could also be formed without departing from the scope of the invention. A dielectric layer 14 may be formed outwardly from first substrate 12. Dielectric layer 14 may comprise, for example, a layer of oxide and may form a gate oxide layer for transistor 10. Dielectric layer 14 may also comprise a dielectric material other than oxide. A front gate 15 may be formed outwardly from dielectric layer 14. Front gate 15 may comprise a first gate layer 16 disposed outwardly from dielectric layer 14. First gate layer 16 may comprise, for example, 1500 Å of polysilicon. Particular dimensions and materials indicated throughout this document are specified for exemplary purposes only. Other materials of different dimensions could be substituted without departing from the scope of the invention.

Front gate 15 may further comprise a second gate layer 18. Second gate layer 18 may comprise, for example, a silicide body formed by introducing an appropriate metal, such as titanium, to the surface of first gate layer 16 and annealing the structure to cause a reaction between the deposited metal and the silicon of first gate layer 16. Any appropriate metal may be used in this process, such as titanium, platinum, cobalt, or molybdenum. Sidewall spacers 28 may be formed adjacent to the sidewalls of front gate 15. Sidewall spacers 28 may comprise any suitable dielectric, such as oxide.

A self-aligned implant region 26 may be formed in first substrate 12 inwardly from channel region 24 in approximate vertical alignment with front gate 15 and having a width approximately equal that of front gate 15. In this embodiment, self-aligned implant region 26 is a punch-through implant formed within first substrate 12. Self-aligned implant region 26 may be formed, for example, by implanting ions of appropriate energies through an exposed portion of a pattern used to form front gate 15. Additional details regarding the formation of self-aligned implant region 26 will be given below. Utilizing the gate definition pattern to align self-aligned implant region 26 with front gate 15 provides an advantage of controlling the area of implantation, minimizing overlap of the implantation region with the source and drain regions of the transistor.

Figure 2:
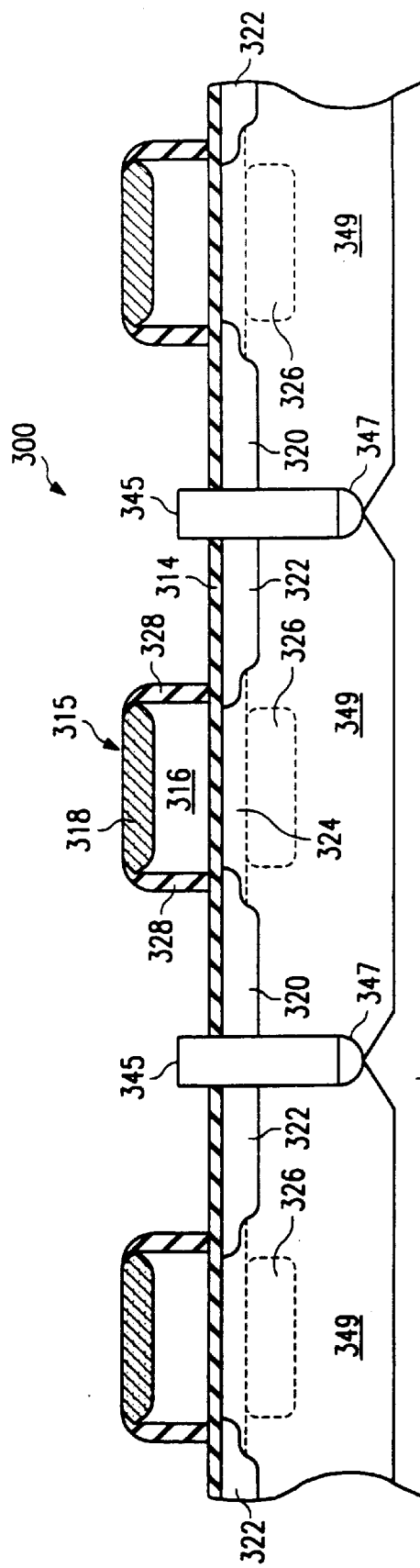
FIG. 2 is a cross-sectional view of another embodiment of a transistor having a self-aligned implant according to the teachings of the present invention.

FIG. 2 shows a cross-sectional view of another embodiment of a transistor with a self-aligned implant region according to the teachings of the present invention. Local well transistor 300, shown in FIG. 2, is similar in structure to punch-through transistor 10 of FIG. 1. Like punch-through transistor 10, local well transistor 300 includes a dielectric layer 314 disposed outwardly from a semiconductor substrate 312, which includes a source region 320, a drain region 322 and a channel region 324 disposed between the source and drain regions. A front gate 315 is disposed outwardly from dielectric layer 314. Front gate 315 may include a first gate layer 316 and a second gate layer 318. Sidewall spacers 328 may be formed adjacent to the sidewalls of front gate 315. Front gate 315 and sidewall spacers 328 are similar in structure and function to like structures in FIG. 1.

Area wells 349 may be formed within substrate 312 and separated by trench isolation barriers 345. Trench isolation barriers 345 may include isolation implants 347. Area wells 349 may be formed by lightly doping area of substrate 312 to produce area wells 349 having relatively high resistivity (e.g. 1–20 Ohm-centimeters). Alternatively, area wells 349 may comprise a single near intrinsic material, which also provides high resistivity. In this embodiment, a self-aligned implant region 326 comprises a local well disposed within area well 349. Local well 326 may reside inwardly from and in approximate vertical alignment with front gate 315. Local well 326 may be more heavily doped than area well 349 to provide a region having lower resistivity than area well 349 (e.g. 0.1 to 1 Ohm-centimeters).

Multiple local wells 326 may reside within a single area well 349. Optionally, multiple local wells may be coupled by low resistivity regions (not explicitly shown). Where, as shown here, local wells 326 are separated by isolation barriers 345, local wells may be coupled to a power source by any appropriate means appropriate to a particular application. For example, local well 326 may be coupled to front gate 315 or source 320 of its associated transistor, or to a control signal, such as a stand-by signal, for threshold modulation. Alternatively, local well 326 may be left floating, responsive to capacitive coupling at the diode junctions. Local well structures provide an advantage of facilitating different well voltages on transistors within the same area well. Local well structures facilitate low junction capacitance and low leakage current.

Figure 3:
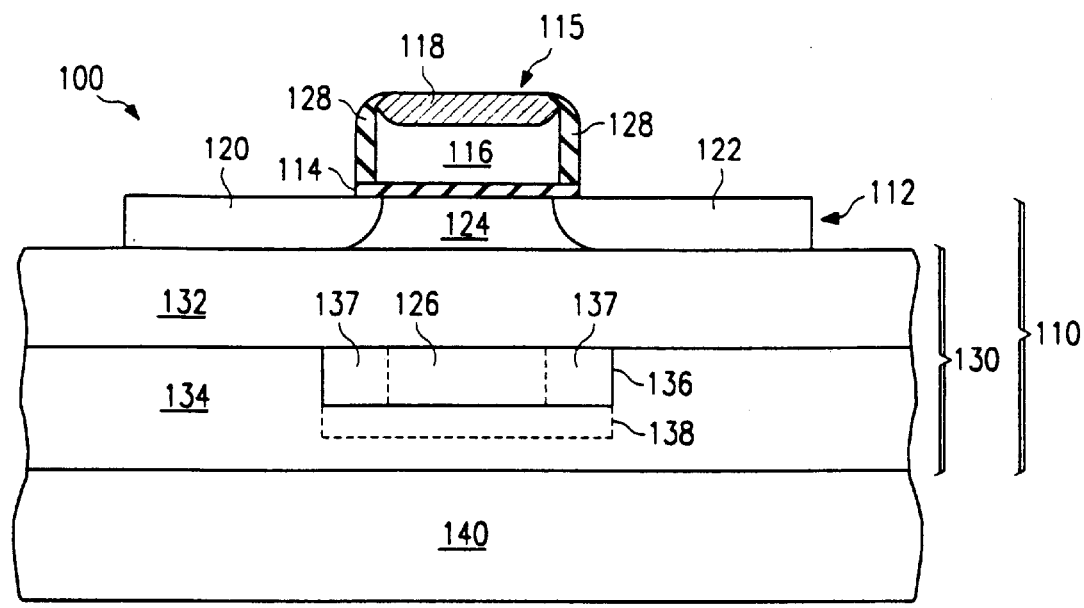
FIG. 3 is a cross-sectional view of yet another embodiment of a transistor having a self-aligned implant region according to the teachings of the present invention.

FIG. 3 shows a cross-sectional view of another embodiment of a transistor with a self-aligned implant region according to the teachings of the present invention. In this embodiment, a transistor 100 comprises a double gate transistor including a silicon-on-insulator structure 110. Silicon-on-insulator structure 110 includes a buried dielectric layer 130. Buried dielectric layer 130 may comprise any appropriate dielectric material, such as oxide. A first semiconductor substrate 112 may be formed outwardly from buried dielectric layer 130. First substrate layer 112 is similar in structure and function to first substrate layer 12 of FIG. 1. First substrate layer 112 includes a source region 120, a drain region 122, and a channel region 124 between source region 120 and drain region 122. A dielectric layer 114 may be disposed outwardly from channel region 124 of first substrate layer 112. Dielectric layer 114 may comprise any suitable dielectric material, such as oxide. A front gate 115 may be disposed outwardly from dielectric layer 114. Front gate 115 is similar in structure and function to front gate 15 of FIG. 1. Front gate 115 may include a first gate layer 116 disposed outwardly from dielectric layer 114. A second gate layer 118 may be formed outwardly from first gate layer 116. Second gate layer 118 is similar in structure and function to second gate layer 18 of FIG. 1. Sidewall spacers 128 may be formed along the sidewalls of front gate 115.

Buried dielectric layer 130 may comprise a first buried dielectric layer 132 disposed inwardly from first substrate layer 112, as well as a second buried dielectric layer 134 disposed inwardly from first buried dielectric layer 132. A back gate 136 may reside within buried dielectric layer 130 disposed inwardly from channel region 124. Specifically, back gate 136 may be disposed inwardly from first buried dielectric layer 132 and within second buried dielectric layer 134. A conductive back gate contact layer 138 may be disposed inwardly from back gate 136 to provide external connection to back gate 136 or to reduce the resistance along back gate 136. Back gate contact layer 138 may be formed from any conductive material, such as tungsten. Silicon-on-oxide structure 110 may be coupled to a second semiconductor substrate layer 140. In this embodiment, a self-aligned implant region 126 may be formed within back gate 136 inwardly from and in approximate vertical alignment with front gate 116. Self-aligned implant region 126 may be formed in a manner similar to the formation of self-aligned implant region 26 described above.

A single back-gate transistor structure may be formed similar to double back gate structure 100 shown in FIG. 2, by self aligning back gate implant region 126 to source region 120 and drain region 122 and omitting front gate 115.

Figure 4:
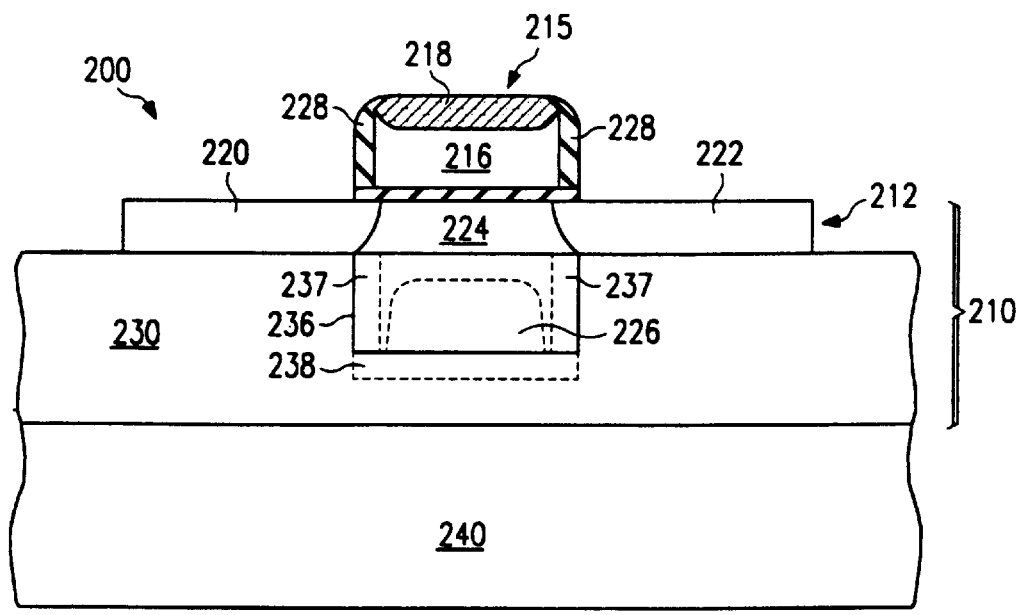
FIG. 4 is a cross-sectional view of still another embodiment of a transistor having a self-aligned implant region according to the teachings of the present invention.

FIG. 4 shows a cross-sectional view of another embodiment of a transistor with a self-aligned implant region according to the teachings of the present invention. A transistor 200 comprises a silicon-on-insulator structure 210 having a back body contact 236. Transistor 200 is similar in structure and function to transistor 100 shown in FIG. 2 transistor 200, however, utilizes back body contact 236 rather than back gate 136. Silicon-on-oxide structure 210 includes a first semiconductor substrate layer 212 disposed outwardly from a buried dielectric layer 230. As in the previous embodiments, first substrate layer 212 includes a source region 220, a drain region 222 and a channel region 224 disposed between source region 220 and drain region 222.

Silicon-on-insulator structure 210 further comprises back body contact region 236 disposed within buried dielectric layer 230 inwardly from channel region 224 of first substrate layer 212. A dielectric layer 214 may be disposed outwardly from channel region 224 of silicon-on-insulator structure 210. A front gate 215 may be formed outwardly from dielectric layer 214. Front gate 215 may include a first gate layer 216 and a second gate layer 218. Second gate layer 218 may be formed outwardly from first gate layer 216. First gate layer 216 and second gate layer 218 are similar in structure and function to first gate layers 16, 316 and 116 and second gate layers 18, 318 and 118 of FIGS. 1, 2, and 3, respectively. In this embodiment, a self-aligned implant 226 resides within back body contact 236 disposed inwardly from and in approximate vertical alignment with front gate 215. Self-aligned implant region 226 may be formed in a manner similar to the formation of self-aligned implant region 26 described above. A conductive contact layer 238 may be disposed inwardly from back body contact 236. Conductive contact layer 238 may act to reduce the resistance of back body contact 236. Conductive contact layer 238 may comprise any material suitable to reduce the back contact resistance.

FIGS. 5a–5e show an exemplary series of process steps in the formation of one embodiment of a punch-through implant transistor 10 according to the teachings of the present invention. Referring to FIG. 4a, dielectric layer 14 may be formed outwardly from first substrate layer 12. A front gate layer 50 may be formed outwardly from dielectric layer 14. Front gate layer 50 may ultimately be used to form first gate layer 16. Materials used to construct front gate layer 50 may be chosen to obtain a desired work function. For example, front gate layer 50 may comprise n-doped polysilicon, p-doped polysilicon, or silicon germanium.

A selective implantation pattern 60 may be formed outwardly from front gate layer 50. Selective implantation pattern 60 may comprise an etch pattern of photoresist including a window region 62, which exposes an area of front gate layer 50 disposed outwardly from channel region 24. Window portion 62 of selective implantation pattern 60 forms an area through which ions may be implanted to form self-aligned implant region 26. Self-aligned implant region 26 is formed by implanting ions with appropriate energy levels through window portion 62 of selective implantation pattern 60 into a region of first substrate 12 between where source region 20 and drain region 22 will be formed. Multiple implants of different quantities of ions having various energy levels may be used to tailor the doping profile as desired. Self-aligned implant region 26 may be doped with ions of a type complementary to the dopant of source region 20 and drain region 22. For example, if source region 20 and drain region 22 are doped with an n-type dopant, self-aligned implant region 26 may be doped with a p-type dopant. If source region 20 and drain region 22 are doped with a p-type dopant, self-aligned implant region 26 may be doped with an n-type dopant. Self-aligned implant region 26 thus provides an advantage of forming a barrier between source region 20 and drain region 22, which helps to prevent source-drain punch through, while avoiding overlap of the implant region with the source and drain regions of the transistor.

Figure 5A:
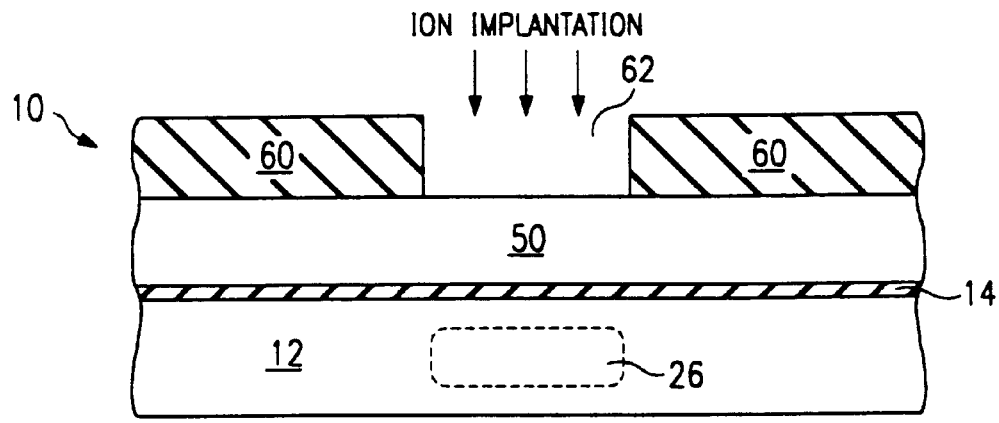
FIGS. 5a–5e show an exemplary series of process steps in the formation of one embodiment of a transistor having a self-aligned implant region according to the teachings of the present invention.
Figure 5B:
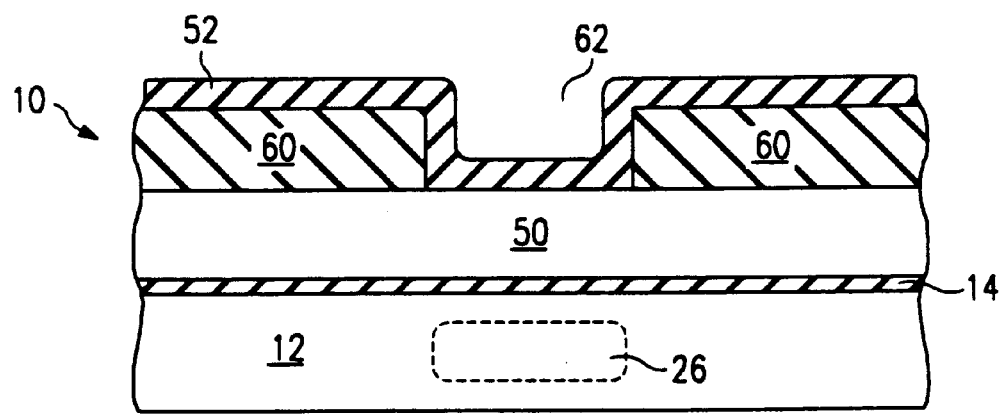

FIG. 5b shows transistor 10 after a metal 52 has been deposited outwardly from selective implantation pattern 60. Any metal suitable to form a silicide structure may be used, such as titanium, cobalt, platinum, or molybdenum. Transistor 10 may be annealed, causing a region of metal 52 within window region 62 to react with a region of front gate layer 50 exposed by window region 62. These regions of metal 52 and front gate layer 50 may react to form a silicide.

Figure 5C:
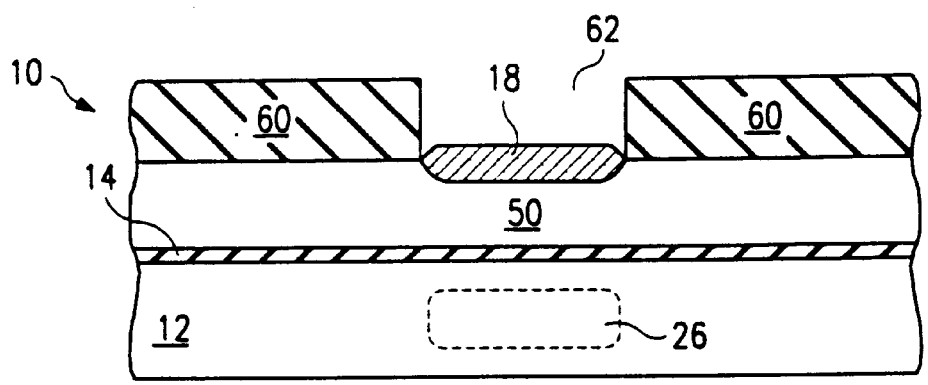

FIG. 5c shows transistor 10 after unreacted portions of metal 52 have been removed from selective implantation pattern 60. Second gate layer 18 remains within window portion 62 of selective implantation pattern 60.

Figure 5D:
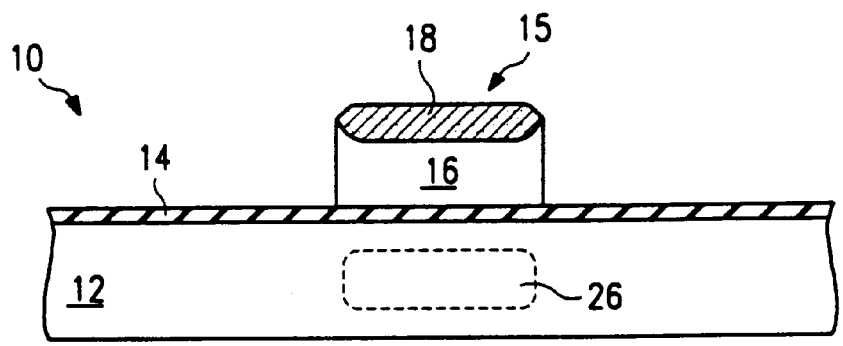

FIG. 5d shows transistor 10 after selective implantation pattern 60 has been removed and front gate 15 has been formed. Front gate 15 may be formed, for example, by etching away portions of front gate layer 50 and leaving a portion of front gate layer 50, which forms first gate layer 16. Second gate layer 18 may serve as a mask when etching front gate layer 50 to ensure that the region of material forming first gate layer 16 remains undisturbed. Various methods may be used to pattern front gate layer 50 as masked by second gate layer 18 including etching, ashing, ion milling and oxidation.

Figure 5E:
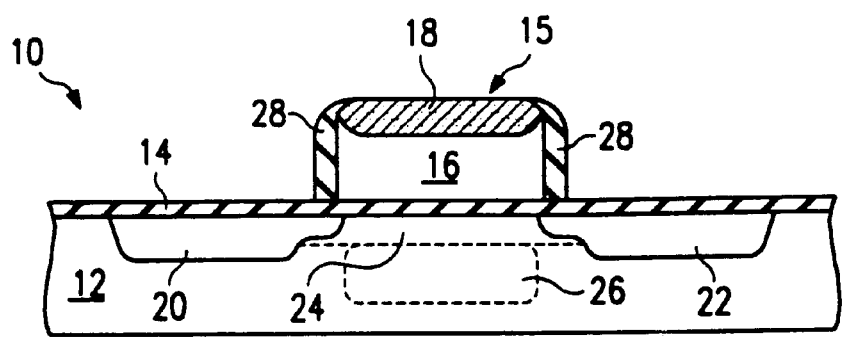

FIG. 5e shows transistor 10 after sidewall spacers 28 have been formed adjacent to the sidewalls of front gate 15, and source and drain regions 20 and 22 have been formed. Sidewall spacers 28 may be formed, for example, by depositing a conformal dielectric followed by an anisotropic etch leaving dielectric disposed outwardly from the sidewalls of front gate 15. The source and drain implant may be done following sidewall spacer formation to form source region 20 and drain region 22. Optionally, multiple sidewall formation and implant sequences may be conducted to tailor the lateral drain profile.

Local well transistor 300 shown in FIG. 2 may be formed using the steps described above with reference to FIGS. 5a–5e. In addition to the aforementioned steps, area wells 349 may be formed by lightly doping areas of substrate 312 surrounding several local wells 326. Isolation barriers 345 may be formed between transistors by etching trenches into substrate 312 between floating gates 316 and depositing dielectric material to fill the trenches.

Figure 6A:
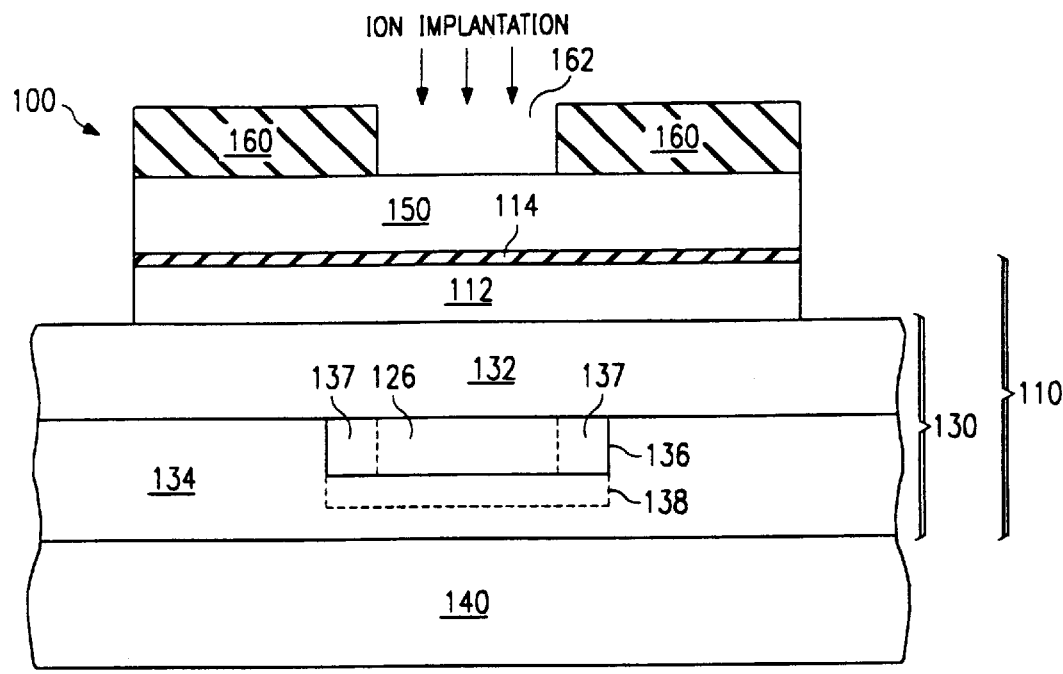
FIGS. 6a–6d show an exemplary series of process steps in the formation of another embodiment of a transistor with a self aligned implant region according to the teachings of the present invention.

FIGS. 6a–6d show an exemplary series of process steps in the formation of another embodiment of a transistor with a self-aligned implant region according to the teachings of the present invention. FIG. 6a shows a double gate transistor 100 during the formation of self-aligned implant region 126 within back gate 136. Silicon-on-insulator structure 110 may be formed by growing or depositing first buried dielectric layer 132 inwardly from first substrate layer 112. Back gate 136 may be formed inwardly from first buried dielectric layer 132. Back gate conductor layer 138 may be formed inwardly from back gate 136. Second buried dielectric layer 134 may then be formed inwardly from first buried dielectric layer 132 and back gate conductive contact layer 138. Second buried dielectric layer 134 may next be planarized and bonded to second substrate layer 140.

First substrate layer 112 may be thinned to form a thin silicon film. Front gate layer 150 may be formed outwardly from dielectric layer 114. Selective implantation pattern 160 is disposed outwardly from front gate layer 150, such that window region 162 is approximately centered over back gate 136. Self-aligned implant region 126 is formed by implanting ions through window region 162 into an area of back gate 136 in vertical alignment with window region 162. Regions 137 of back gate 136 may be lightly doped oppositely to the doping of self-aligned implant region 126 such that regions 137 will be depleted.

Figure 6B:
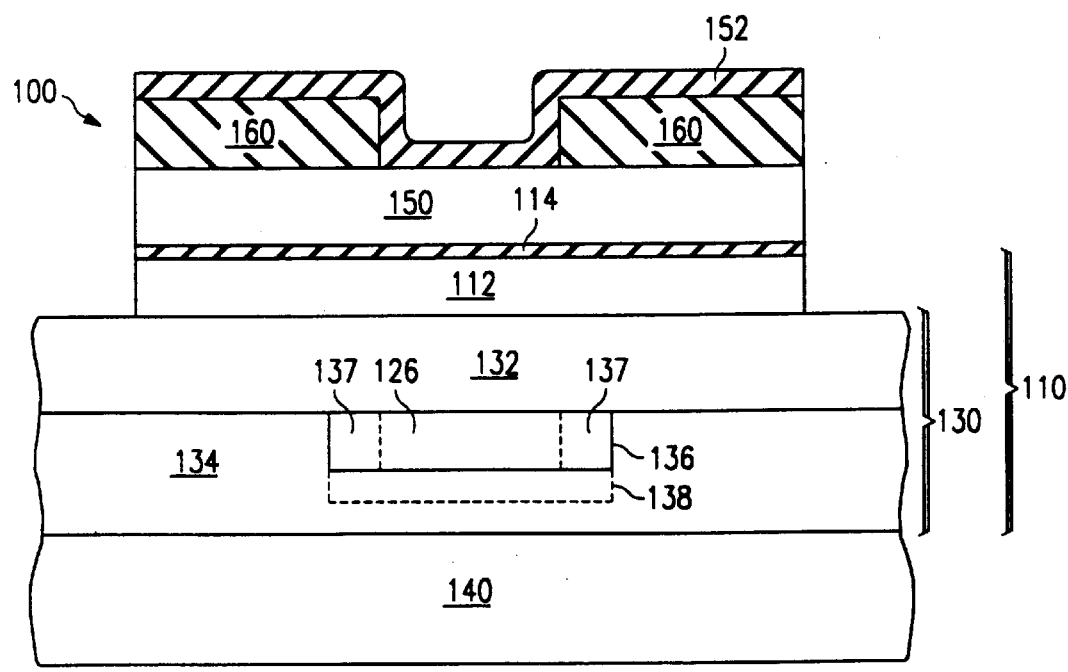
Figure 6C:
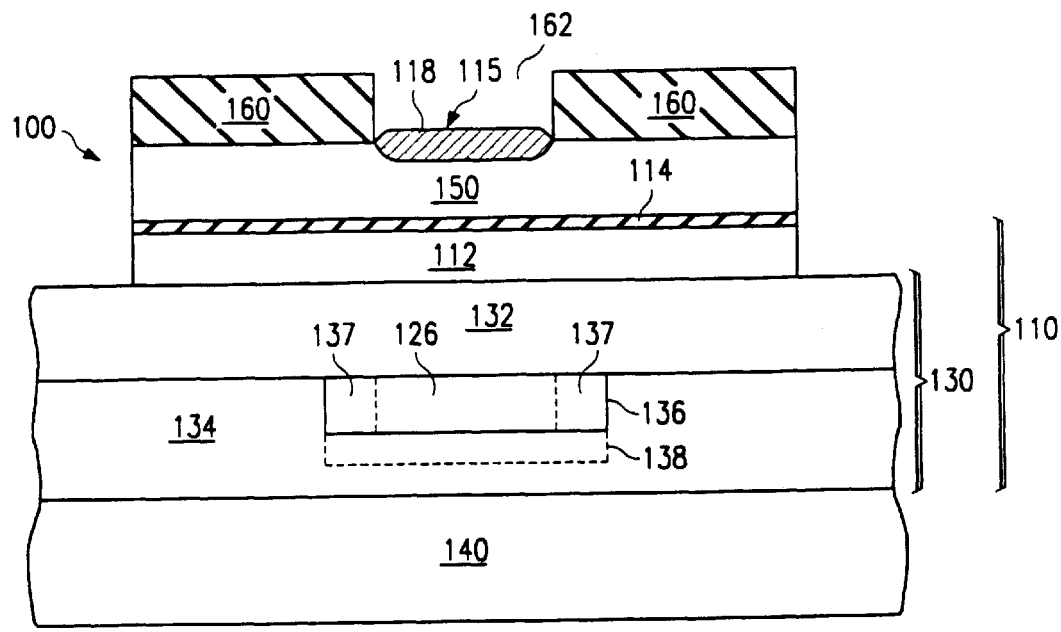

FIGS. 6b–6c illustrate an exemplary method of forming second gate layer 118 of transistor 100, where second gate layer 118 comprises a silicide body. An appropriate metal 152 is disposed outwardly from selective implantation layer 160 and annealed. Annealing transistor 100 causes the portion of metal 152 disposed within window region 162 to react with an adjacent area of front gate layer 150, forming second gate layer. The unreacted portion of metal 152 is removed, leaving second gate layer 118.

Figure 6D:
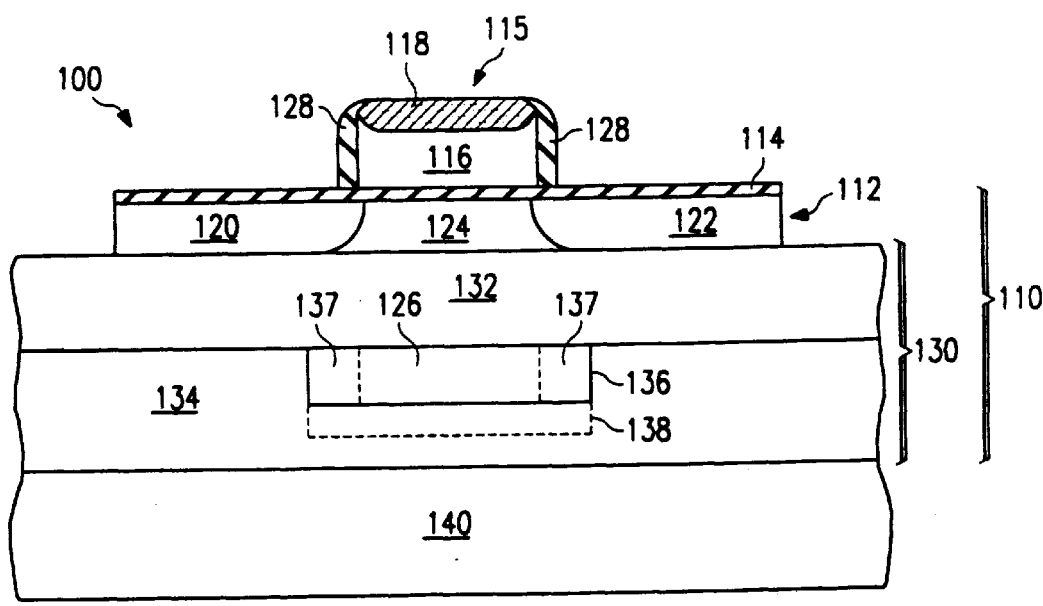

FIG. 6d shows transistor 100 after removal of selective implantation pattern 160 and formation of front gate 115. Front gate 115 may be formed through a process analogous to the process for forming front gate 15 described above in reference to FIG. 5d. Second gate layer 118 may be used as a mask to protect first gate layer 116 while the remainder of front gate layer 150 is etched away. Sidewall spacers 128 may be formed adjacent to the sidewalls of front gate 115 in a manner analogous to the formation of sidewall spacers 28 of transistor 10. Source region 20 and drain region 22 may be then be formed in a manner similar to that described above.

The process steps in the formation of transistor 200 (FIG. 4) are similar to those described with reference to transistor 100 (FIGS. 6a–6d). Transistor 200, however, implements a back body contact 238, rather than a back gate 136 of transistor 100. Referring to FIG. 3, silicon-on-insulator layer 210 may be constructed by forming back body contact 236 inwardly from first substrate layer 212. Back body contact 236 may be formed in a variety of ways. For example, back body contact 236 may comprise a portion of first substrate layer 212 formed by patterning and etching regions of first substrate layer 212 to leave back body contact 236. Another method of forming back body contact 236 is to selectively grow silicon inwardly from first substrate layer 212. Yet another method of forming back body contact 236 is to deposit polysilicon or amorphous silicon inwardly from first substrate layer 212, and perform a pattern etch to define the structure of back body contact 236. Forming back body contact 236 from single crystal silicon provides an advantage of reducing the probability of high junction leakage typically associated with polysilicon solutions. Any suitable method of forming a back body contact structure may be implemented. The above-described methods are merely examples, and other methods could be used without departing from the scope of the invention. Back body contact conductive layer 238 may be disposed inwardly from back body contact 236.

Buried dielectric layer 230 may be disposed inwardly from first substrate layer 212 and back body contact 236. Buried dielectric layer 230 may be planarized and bonded to second substrate layer 240. As described with respect, to transistor 100 (FIG. 6a), first substrate layer 212 may be thinned to form a thin silicon film disposed outwardly from buried dielectric layer 230. Source region 220, drain region 222, and channel region 224 may be formed in first it substrate layer 212, completing the structure of silicon-on-insulator structure 210.

Self-aligned implant region 226 comprises a region of back body contact region in approximate vertical alignment with front gate 215. Formation of self-aligned implant region 226 follows the process steps described above with respect to the formation of self-aligned implant region 126 of transistor 100. The process steps are identical, except that ions are implanted into a region of back body contact 236, rather than a back gate region.

Although the present invention has been described in detail it should be understood that various changes and substitutions may be made hereto without departing from the scope of the present invention as defined by the appended claims.

What is claimed is:

1. A method of forming a transistor having a self-aligned implant region, the method comprising:

forming a drain region;

forming a source region opposite the drain region;

forming a channel region in a semiconductor substrate extending between the source region and the drain region;

forming a dielectric layer disposed outwardly from the substrate;

forming a front gate layer disposed outwardly from the dielectric layer;

forming a selective implantation pattern disposed outwardly from the front gate layer, the selective implantation pattern comprising a window region disposed outwardly from the channel region;

forming a self-aligned implant region by implanting ions into the substrate through the window portion of the selective implantation pattern;

forming a second gate layer approximately coextensive with the window portion of the selective implantation pattern and disposed outwardly from the front gate layer; and etching the front gate layer using the second gate layer as a mask to form a first gate layer disposed inwardly from the second gate layer and disposed outwardly from the dielectric layer.

2. The method of claim 1, wherein forming the second gate layer comprises:

depositing a metal outwardly from the selective implantation pattern; and annealing the transistor to cause at least a portion of the metal to react with a region of the front gate layer exposed by the window region of the selective implantation pattern, creating a silicide body disposed outwardly from the front gate layer and approximately coextensive with the window region of the selective implantation pattern.

3. A method of forming a transistor having a self-aligned implant region, the method comprising:

forming a source region;

forming a drain region opposite the source region;

forming a channel region in a first semiconductor substrate extending between the source region and the drain region;

forming a buried dielectric layer inwardly from the first substrate;

forming a back contact disposed within the buried dielectric layer inwardly from the channel region of the first substrate to create a silicon-on-insulator structure;

forming a dielectric layer disposed outwardly from the first substrate of the silicon-on-insulator structure;

forming a front gate layer disposed outwardly from the dielectric layer;

forming a selective implantation pattern disposed outwardly from the front gate layer, the selective implantation pattern comprising a window region disposed outwardly from the channel region of the silicon-on-insulator structure and approximately centered over the back contact of the silicon-on-insulator structure;

forming a self-aligned implant region by implanting ions into the back contact of the silicon-on-insulator structure through the window portion of the selective implantation pattern;

forming a second gate layer disposed outwardly from the front gate layer coextensive with the window portion of the selective implantation pattern; and etching the front gate layer using the second gate layer as a mask to form a first gate layer disposed inwardly from the silicide body and disposed outwardly from the dielectric layer.

4. The method of claim 3, wherein forming the second gate layer comprises:

depositing a metal outwardly from the selective implantation pattern; and annealing the transistor to cause at least a portion of the metal to react with a region of the front gate layer exposed by the window region of the selective implantation pattern, creating a silicide body disposed outwardly from the front gate layer and approximately coextensive with the window region of the selective implantation pattern.

5. The method of claim 3, wherein forming a buried dielectric layer and forming a back contact comprise:

forming a first buried dielectric layer inwardly from the first substrate;

forming a back contact layer inwardly from the first buried dielectric layer;

etching the back contact layer to form a back gate disposed inwardly from the channel region and separated from the first substrate by the first buried dielectric layer; and forming a second buried dielectric layer inwardly from the first buried dielectric layer and the back gate.

6. The method of claim 5, further comprising:

planarizing a surface of the second buried dielectric layer; and bonding a second substrate layer to the planarized surface of the second buried dielectric layer.

7. The method of claim 3, wherein forming a back contact comprises the step of etching a portion of the first substrate to form a back body contact disposed inwardly from the channel region of the first substrate layer.

8. The method of claim 3, wherein forming a buried dielectric layer and forming a back contact comprise:

growing a back contact layer inwardly from the channel region of the first substrate; and forming a buried dielectric layer inwardly from the first substrate and the back body contact.

9. The method of claim 3, wherein forming a buried dielectric layer and forming a back contact comprise:

depositing a back contact layer inwardly from the first substrate;

etching the back contact layer to form a back body contact disposed inwardly from the channel region of the first substrate; and forming a buried dielectric layer inwardly from the first substrate and the back body contact.

10. The method of claim 3, wherein forming a buried dielectric layer and forming a back contact comprise:

forming a back body contact region inwardly from the channel region of the first substrate; and forming a buried dielectric layer inwardly from the first substrate and the back body contact region.

11. The method of claim 10, further comprising the steps of:

planarizing a surface of the buried dielectric layer; and bonding a second substrate to the planarized surface of the buried dielectric layer.

12. The method of claim 3, further comprising the step of forming side wall spacers adjacent to the sidewalls of the gate body.

* * * * *